United States Patent [19]

Sasaki

[11] Patent Number: 5,363,058
[45] Date of Patent: Nov. 8, 1994

[54] AMPLIFIER HAVING LINEAR INPUT-OUTPUT CHARACTERISTICS AND HIGH EFFICIENCY

[75] Inventor: Yoshinobu Sasaki, Itami, Japan

[73] Assignee: Mitsubishi Denki Kabushiki Kaisha, Tokyo, Japan

[21] Appl. No.: 29,594

[22] Filed: Mar. 11, 1993

[30] Foreign Application Priority Data

Mar. 19, 1992 [JP] Japan .................................. 4-093748

[51] Int. Cl.⁵ .............................................. H03G 3/30
[52] U.S. Cl. .................................. 330/136; 330/277; 330/279
[58] Field of Search ................ 330/136, 277, 278, 279

[56] References Cited

U.S. PATENT DOCUMENTS

| 4,268,797 | 5/1981 | Buck et al. | 330/277 |
| 4,320,352 | 3/1982 | Rubin et al. | 330/277 |

FOREIGN PATENT DOCUMENTS

| 0033198 | 1/1981 | European Pat. Off. . |
| 2523782 | 3/1983 | France . |
| 61-103307 | 5/1986 | Japan . |
| 61-296804 | 12/1986 | Japan . |
| 63-202107 | 8/1988 | Japan . |
| 149108 | 6/1990 | Japan | 330/136 |

Primary Examiner—James B. Mullins
Attorney, Agent, or Firm—Leydig, Voit & Mayer

[57] ABSTRACT

An amplifier for amplifying a high frequency signal includes an input impedance matching circuit; an output impedance matching circuit; an FET having a gate and a drain connected to the input impedance matching circuit and the output impedance matching circuit, respectively; and a gate voltage control circuit for controlling the gate voltage of the FET in response to the power of the high frequency signal. The gate voltage control circuit includes a diode having an anode connected to the gate, a capacitor connected between the cathode of the diode and ground, and a gate bias setting circuit connected to the junction of the diode and the capacitor. The gate bias setting circuit outputs a control voltage corresponding to the power of the high frequency signal. As a result, impedance matching by the output matching circuit is not disturbed and the linearity of the output power to the input power is maintained so that the amplifier operates highly efficiently.

3 Claims, 3 Drawing Sheets

AMPLIFIER HAVING LINEAR INPUT-OUTPUT CHARACTERISTICS AND HIGH EFFICIENCY

FIELD OF THE INVENTION

The present invention relates to an amplifier that amplifies a high-frequency wave of more than one GHz and, more particularly, to an amplifier that has linear input-output characteristics and operates with high efficiency.

BACKGROUND OF THE INVENTION

FIG. 5 is a block diagram showing a prior art amplifier that amplifies a high-frequency wave of more than one GHz. In FIG. 5, reference numeral 10 designates an FET as an active element. A source of the FET 10 is grounded. An input terminal 11 is connected to a gate of the FET 10 through an input matching circuit 30. An output terminal 18 is connected to a drain of the FET 10 through an output matching circuit 40. A signal which is input to the gate is amplified and output from the drain side. In the input matching circuit 30, an input end of a high frequency transmission line 12a is connected to the input terminal 11, a high frequency transmission line 12b and a capacitor 15 are serially connected between the gate of the FET 10 and the ground, and a gate bias terminal 13, which is an output terminal of a gate bias setting circuit 14, is connected to the junction of the high frequency transmission line 12b and the capacitor 15. In the output matching circuit 40, an output end of a high frequency transmission line 16a is connected to the output terminal 18, a high frequency transmission line 16b and a capacitor 17 are serially connected between the drain of the FET 10 and the ground, and a drain bias terminal 20, which is an output terminal of a drain bias setting circuit 19, is connected to the junction of the high frequency transmission line 16b and the capacitor 17. In addition, an external circuit, comprising a load 22 and a DC blocking capacitor 21 connected in series, is connected to the output terminal 18. An external circuit comprising a high frequency signal generating power supply, a load, and the like (not shown) is connected to the input terminal 11.

FIG. 7 is a block diagram showing a circuit structure of the gate bias setting circuit 14 in the input matching circuit 30 (or the drain bias setting circuit 19 in the output matching circuit 40). The gate bias setting circuit 14 (or the drain bias setting circuit 19) comprises a power distributor 24 that extracts out a part of an input signal power applied to the input terminal 11, a power detector 25 that detects the power taken out by the power distributor 24, and a voltage generator 23 that outputs a control applied to the gate bias terminal 13 (drain bias terminal 20) in accordance with the detected power.

A description is given of the operation.

The input impedance matching circuit 30 is provided to match an input impedance of the FET 10 with an impedance of the external circuit (not shown) connected to the gate input of the FET 10 through the input terminal 11. The external circuit comprises the high frequency signal generating power supply, the load, and the like (not shown). Similarly, the output impedance matching circuit 40 is provided to match an output impedance of the FET 10 with an impedance of the external circuit connected to the drain output of the FET 10 through the output terminal 18. When a high frequency signal generated in the high frequency signal generating power supply in the external circuit is input to the input terminal 11, the high frequency signal is amplified by the FET 10 and output from the output terminal 18.

FIGS. 6(a) and 6(b) are diagrams showing operating characteristics of the amplifier of FIG. 5, in which FIG. 6(a) shows an I-V characteristic of the drain of the FET 10 and FIG. 6(b) shows an input-output power characteristic of the FET 10. The operation of the amplifier of FIG. 5 will be described in more detail with reference to FIGS. 6(a) and 6(b).

In FIG. 6(a), where the gate bias and the drain bias are controlled so that a bias point may be point a0 in FIG. 6(a) and a high frequency signal is amplified by a class "B" operation, an output signal after being amplified, i.e., a signal having a drain current and a drain voltage varies along a load curve a1-a0-a2 shown in FIG. 6(a), in accordance with the amplitude of the high frequency signal which is input to the gate (input power. More specifically, when the input power of the high frequency signal which is input to the gate is small, the drain current and the drain voltage move on the load curve in the vicinity of point a0. When the input power increases, the output power which is output from the drain is saturated because the drain current and the drain voltage only take values on the load curve a1-a0-a2 because of the characteristics of the FET. Similarly, when the gate bias and the drain bias are controlled to vary the bias point to points b0 and c0 in FIG. 6(a), the drain current and the drain voltage vary along load curves b1-b0-b2 and c1-c0-c2, which correspond to the bias points b0 and c0, respectively, in accordance with the amplitude of high frequency signal which is input to the gate. When the input power increases, the output power which is output from the drain is saturated in the same manner as described above. FIG. 6(b) shows a relation between the input power of the high frequency signal which is input to the gate of the FET and the output power of the output signal which is output from the drain of the FET. In FIG. 6(b), curves a, b, and c are input-output power characteristic curves corresponding to the bias points a0, b0, and c0, respectively.

Generally, in order to achieve a highly-efficient operation in an amplifier, it is desirable that the output power is output in the saturated state of the amplifier. In the conventional amplifier shown in FIG. 5, a highly-efficient operation is achieved by controlling the gate bias and the drain bias of the FET 10 by the gate bias setting circuit 14 and the drain bias setting circuit 19, respectively, so as to vary the bias point in accordance with the input power of the input signal. More specifically, a part of the high frequency signal power which is input to the input terminal 11 is taken out by the power distributor 24 included in the drain bias setting circuit 19 (or the gate bias setting circuit 14). Then, the power taken out by the power distributor 24 is detected by the power detector 25, and a prescribed voltage is generated in the voltage generator 23 and applied to the drain bias terminal 20 (or the gate bias terminal 13) in accordance with the power detected by the power detector 25. In this way, the gate bias and the drain bias of the FET 10 are controlled so that the bias point may always take the points a0, b0, and c0, at which the output power is in the saturated state of the amplifier, in accordance with the detected input power Pia, Pib, Pic, respectively, as shown in FIG. 6(b). As the result, output powers Poa, Pob, and Poc corresponding to the input powers Pia, Pib, and Pic are obtained in their saturated state, respectively. In addition, as shown by the dotted line in FIG. 6(b), the amplifier is controlled while maintaining the linearity of the output power to the input power.

In the conventional amplifier, however, when the gate bias and the drain bias of the FET 10 are controlled by the gate bias setting circuit 14 and the drain bias setting circuit 19, respectively, in accordance with the input power, the control voltage generated from the drain bias setting circuit 19 must be large because when a large current flows into the drain, the drain voltage is relatively large, or the like. As the result, the circuit structure of the voltage generator 23 included in the drain bias setting circuit 19 is complicated.

In addition, if the drain bias of the FET 10 varies to a significant degree, matching by the output matching circuit 40 changes, adversely affecting the characteristics of the amplifier.

SUMMARY OF THE INVENTION

It is an object of the present invention to provide an amplifier that efficiently amplifies an input signal with an improved linearity of output power to input power, and prevents deviation in impedance matching of the output matching circuit, using neither a control voltage generated from the gate bias setting circuit in the input matching circuit nor a control voltage generated from the drain bias setting circuit in the output matching circuit.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, an amplifier includes a gate voltage control circuit for controlling a gate voltage in accordance with the input power of an input signal, the gate voltage control circuit being connected to a junction of the gate of an FET and an input matching circuit. Therefore, the input matching circuit matches the input impedance of the FET with an impedance of an external circuit connected to a gate input of the FET, and the output matching circuit matches the output impedance of the FET with an impedance of an external circuit connected to a drain output of the FET. Therefore, the gate voltage is controlled so that a saturated drain current may always be obtained, in accordance with the bias point of the FET set with the impedance matching.

BRIEF DESCRIPTION OF THE DRAWINGS

FIGS. 2(a) and 2(b) are diagrams for explaining operation of the amplifier of FIG. 1, in which FIG. 2(a) shows I-V characteristics at the drain of an FET and FIG. 2(b) shows input-output power characteristics of the FET;

FIGS. 6(a) and 6(b) are diagrams for explaining operation of the amplifier of FIG. 5, in which FIG. 6(a) shows I-V characteristics at the drain of an FET and FIG. 6(b) shows input-output power characteristics of the FET.

DETAILED DESCRIPTION OF THE PREFERRED EMBODIMENTS

Figure 1:
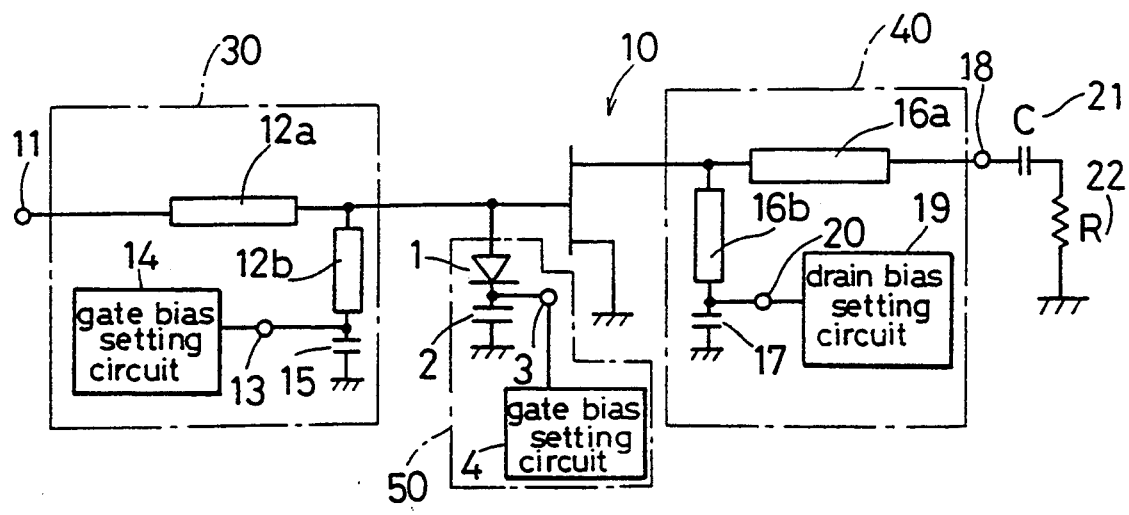
FIG. 1 is a block diagram showing an amplifier in accordance with an embodiment of the present invention.
Figure 4:
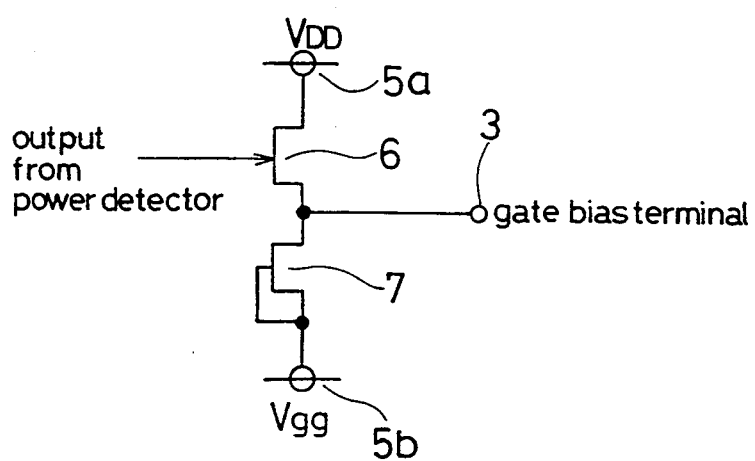
FIG. 4 is an equivalent circuit diagram of a voltage generator of FIG. 3.
Figure 5:
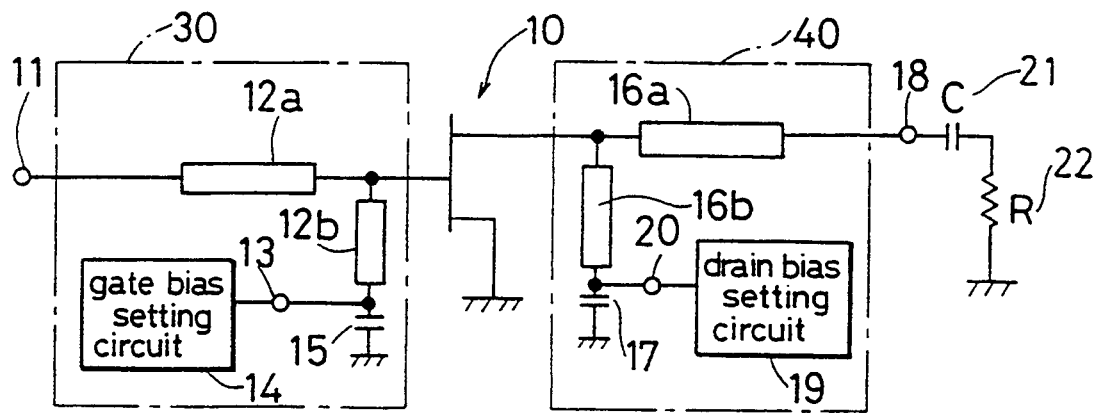
FIG. 5 is a block diagram showing the prior art amplifier.
Figure 6A:
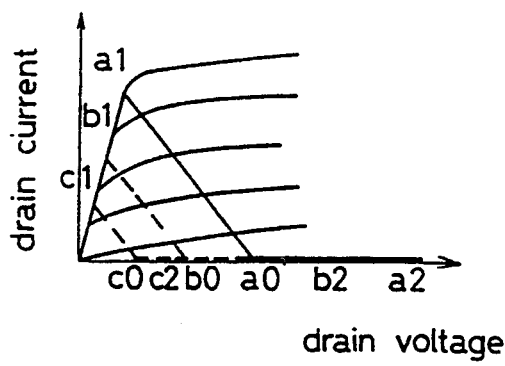
Figure 6B:
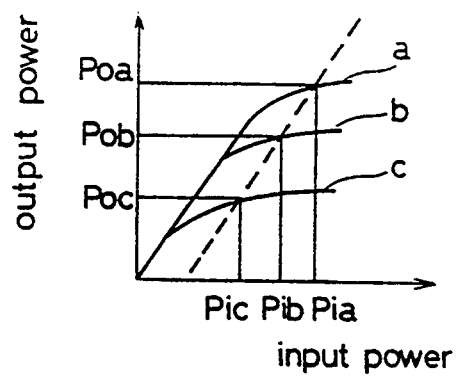
Figure 7:
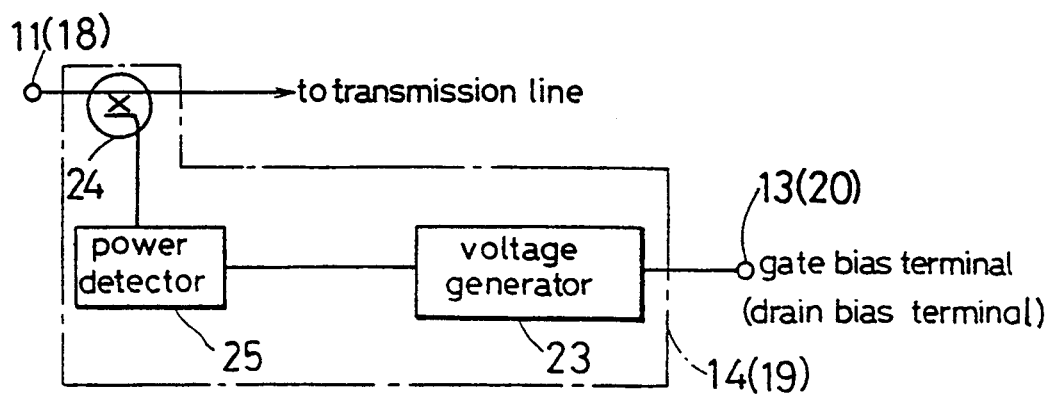
FIG. 7 is a block diagram showing the gate bias setting circuit of FIG. 5.

FIG. 1 is a block diagram showing the structure of an amplifier in accordance with an embodiment of the present invention. In FIG. 1, the same reference numerals as shown in FIG. 4 designate the same or corresponding parts. Reference numeral 50 designates a gate voltage control circuit comprising a diode 1, a capacitor 2, and a gate bias setting circuit 4. The anode of the diode 1 is connected to the gate of the FET 10. The capacitor 2 is connected between the cathode of the diode and the ground. A gate bias terminal 3 which is an output terminal of the gate bias setting circuit 4 is connected to the junction of the diode 1 and the capacitor 2. In this construction where the diode 1 is connected between the gate and the gate bias terminal 3, the gate voltage of the FET 10 does not take a larger value than the voltage of the Schottky barrier voltage of the diode 1 plus a control voltage output from the gate bias setting circuit 4 and applied to the gate bias terminal 3. In addition, the capacitor 2 is provided so that the control voltage generated from the gate bias setting circuit 4 is not grounded and so that a predetermined voltage is applied to the gate of the FET 10.

Figure 3:
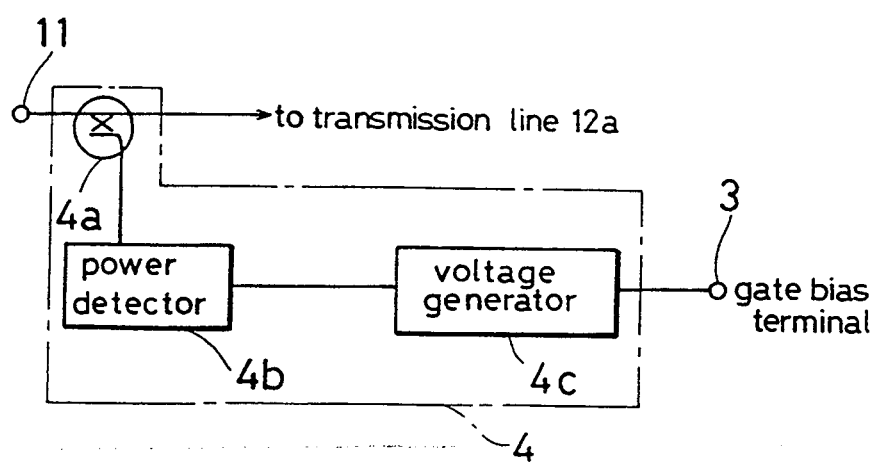
FIG. 3 is a block diagram showing the gate bias setting circuit of FIG. 1.

FIG. 3 is a block diagram showing the structure of the gate bias setting circuit 4 in detail. The gate bias setting circuit 4 comprises a power distributor 4a, a power detector 4b, and a voltage generator 4c. The power distributor 4a is disposed at a place in a line from the input terminal 11 to the transmission line 12a and extracts the part of a power of a signal which is input to the input terminal 11 and to the gate of the FET 10. The power detector 4b detects the power taken out by the distributor 4a. The voltage generator 4c provides a control voltage corresponding to the detected output of the power detector 4b to the gate bias terminal 3.

FIG. 4 is an equivalent circuit diagram showing the voltage generator 4c of FIG. 3. The voltage generator (4c) of FIG. 4 comprises two N channel transistors 6 and 7 serially connected between the constant voltage supply $V_{DD}$ 5a and Vgg 5b. An output from the power detector (4b) is input to the gate of the N channel transistor 6. The gate and source of the N channel transistor 7 are connected to each other. The signal at the junction of the transistors 6 and 7 is output to the gate bias terminal 3.

Figure 2A:
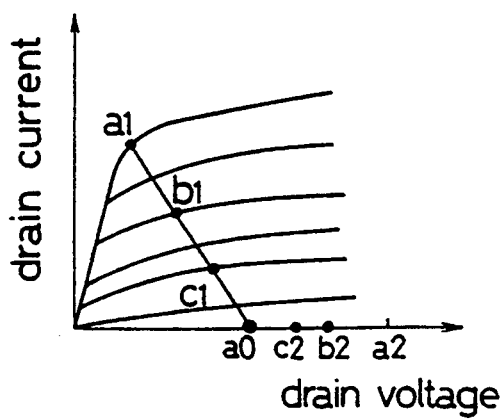
Figure 2B:
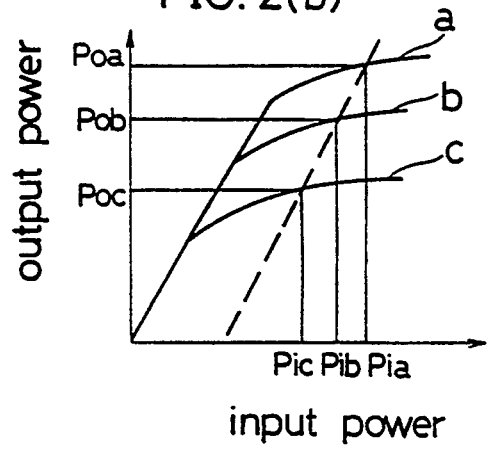

FIGS. 2(a) and 2(b) are diagrams for explaining operating characteristics of the amplifier shown in FIG. 1, in which FIG. 2(a) shows I-V characteristics at the drain of the FET 10 and FIG. 2(b) shows input-output power characteristics of the FET 10.

A description is given of the operation of the circuit shown in FIG. 1.

The input matching circuit 30 matches an input impedance of the FET 10 with an impedance of the external circuit (not shown) whose output is input to the gate of the FET 10 through the input terminal 11. The external circuit comprises, although it is not shown in the figure, a high frequency signal generating power supply, a resistor, or the like. Similarly, the output impedance matching circuit 40 matches the output impedance of the FET 10 with an impedance of the external circuit which is connected to the drain output of the FET 10 through the output terminal 18. This external circuit comprises the capacitor 21 and the resistor 22. A high frequency signal is output from the high frequency signal generating power supply (not shown), input to the gate of the FET 10 through the input terminal 11, amplified by the FET 10, and output through the output terminal 18 connected to the drain of the FET 10.

The operation will be described in more detail with reference to FIGS. 2(a) and 2(b).

First of all, matching of the input and output impedances of the FET 10 with the impedances of the input and output side external circuits are achieved by the input matching circuit 30 and the output matching circuit 40, respectively, and a bias point is set at the point a0 in FIG. 2(a) by the gate bias setting circuit 14 and the drain bias setting circuit 19. In this case, the drain voltage and the drain current of the FET 10 move along a load curve a1-a0-a2 of FIG. 2(a) in accordance with the high frequency signal that is input to the input terminal 11. In this amplifier, after the bias point is set in this way by the input matching circuit 30 and the output matching circuit 40, a power of the high frequency signal is detected by the gate voltage generating circuit 50 and a control voltage corresponding to the detected input power is applied to the gate of the FET 10 from the gate voltage generating circuit 50. More specifically, the power of the high frequency signal is detected by the power distributor 4a and the power detector 4b of the gate bias setting circuit 14 in the gate voltage generating circuit 50, and the control signal corresponding to the detected power is applied to the gate bias terminal 3 from the voltage generator 4c, whereby the gate voltage is reduced and the FET 10 always outputs power in the saturated state of the FET 10.

For example, where the bias point is set at the point a0 of FIG. 2(a) and the control voltage applied to the gate bias terminal 3 from the voltage generator 4c is 0 V, the drain voltage and the drain current move along the load curve a1-a0-a2 of FIG. 2(a) in accordance with an increase in the input power of the input signal. When the input power reaches a certain value, the output power is saturated because the drain voltage and the drain current never take values other than on the load curve a1-a0-a2 because of the characteristics of FET. On the other hand, if the control voltage is reduced to a certain value lower than 0 V, the drain voltage and the drain current move along a load line b1-b2 of FIG. 2(a) because the gate voltage never exceeds the voltage of the Schottky barrier voltage of the diode plus the control voltage even when the input power of the input signal increases. If the control voltage is further reduced to reach a certain value, the drain voltage and drain current move along a load curve c1-c0-c2 of FIG. 2(a).

In FIG. 2(b), curves a, b, and c show input-output characteristic curves of the FET 10 in case where the drain voltage and drain current move on the load curves a1-a0-a2, b1-b0-b2, and c1-c0-c2, respectively. For example, when the input power of the input signal varies between Pia, Pib, and Pic as shown in FIG. 2(b), the gate voltage is controlled by the gate voltage control circuit 50 so that the output powers Poa, Pob, and Poc corresponding to the input powers Pia, Pib, and Pic, respectively, are saturation voltages of the input-output power characteristic curves a, b, and c, respectively. In this way, linearity of the output power to the input power of the FET is maintained as shown by a dotted line in FIG. 2(b), and the output power is produced in the saturated state of the FET.

In the amplifier of the present invention, the gate voltage control circuit 50 provides the control voltage to the gate of the FET 10 at the bias point of the FET 10, which is set by the input matching circuit 30 and the output matching circuit 40, in accordance with the input power of the high frequency signal which is input to the input terminal 11. Therefore, it is possible to control the FET 10 to operate in accordance with the input power of the high frequency signal by means of the control voltage, without changing the bias point of the FET 10, so that a pseudo saturation drain current may always be obtained. As the result, output power of the FET is always obtained in the saturated state of the FET and linearity of the output power to the input power is maintained. In addition, since the gate voltage generating circuit 50 provides the control voltage to the gate of the FET 10 to determine the bias point, the control voltage is small and the structure of the voltage generator 4c included in the gate voltage generating circuit 50 is simplified as shown in FIG. 4. In addition, it is not necessary to change the bias point, thereby preventing change in impedance matching by the output matching circuit.

As is evident from the foregoing description, according to the present invention, the gate voltage control circuit for controlling the gate voltage in accordance with the input power of an input signal is provided at the junction of the gate of the FET and an output end of the input matching circuit. Therefore, output power is always produced in the saturated state of the amplifier, by a small control voltage, while maintaining the linearity of the output power to the input power, without changing the bias point. As the result, impedance matching by the input-output matching circuit does not change and the amplifier always operates with high efficiency.

I claim:

1. An amplifier for amplifying a high frequency signal comprising:

an input impedance matching circuit having an input end and an output end;

an output impedance matching circuit having an input end and an output end;

an FET having a gate connected to the output end of said input impedance matching circuit for receiving a high frequency signal having a power for amplification by said FET and a drain connected to the input end of said output impedance matching circuit; and a gate voltage control circuit for controlling a gate voltage applied to the gate of said FET in response to the power of the high frequency signal, an output of said gate voltage control circuit being connected to a junction of the output end of said input impedance matching circuit and the gate of said FET, said gate voltage control circuit comprising a diode having an anode and a cathode, the anode being connected to the gate of said FET, a capacitor connected between the cathode of said diode and ground, and a gate bias setting circuit having an output terminal connected to the junction of the cathode of said diode and said capacitor for outputting a control voltage in response to the power of the high frequency signal.

2. The amplifier of claim 1 wherein said gate bias setting circuit comprises a distributor for extracting part of the power of the high frequency signal, a power detector connected to said distributor for detecting the power extracted by said distributor and outputting a detector signal in response, and a voltage generator connected to said power detector for outputting a control voltage corresponding to the detector signal of said power detector to the junction of the cathode of said diode and said capacitor.

3. The amplifier of claim 1 wherein said high frequency signal is at least one GHz.

* * * * *